(12) United States Patent
Ishizaka et al.

(10) Patent No.: US 9,425,093 B2
(45) Date of Patent: Aug. 23, 2016

(54) COPPER WIRING FORMING METHOD, FILM FORMING SYSTEM, AND STORAGE MEDIUM

(71) Applicant: TOKYO ELECTRON LIMITED, Tokyo (JP)

(72) Inventors: Tadahiro Ishizaka, Nirasaki (JP); Takashi Sakuma, Nirasaki (JP); Osamu Yokoyama, Nirasaki (JP); Kai-Hung Yu, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/561,331

(22) Filed: Dec. 5, 2014

(65) Prior Publication Data

US 2016/0163591 A1    Jun. 9, 2016

(51) Int. Cl.
| | |
|---|---|
| *H01L 21/768* | (2006.01) |
| *H01L 23/528* | (2006.01) |
| *H01L 23/532* | (2006.01) |
| *H01L 21/285* | (2006.01) |
| *C23C 16/52* | (2006.01) |
| *C23C 14/24* | (2006.01) |
| *C23C 14/54* | (2006.01) |
| *C23C 14/34* | (2006.01) |

(52) U.S. Cl.
CPC .......... *H01L 21/76879* (2013.01); *C23C 14/24* (2013.01); *C23C 14/34* (2013.01); *C23C 14/54* (2013.01); *C23C 16/52* (2013.01); *H01L 21/2855* (2013.01); *H01L 21/28556* (2013.01); *H01L 21/28568* (2013.01); *H01L 21/76843* (2013.01); *H01L 23/528* (2013.01); *H01L 23/53238* (2013.01); *H01L 23/53266* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,447,887 A * | 9/1995 | Filipiak | ............ | H01L 27/76834 257/E21.591 |
| 5,821,168 A * | 10/1998 | Jain | .................... | H01L 21/76807 216/18 |
| 6,566,242 B1 * | 5/2003 | Adams | ............. | H01L 21/31053 257/E21.244 |
| 7,033,944 B2 * | 4/2006 | Park | .................. | H01L 21/76808 257/E21.579 |
| 7,091,133 B2 * | 8/2006 | Goundar | ............... | C23C 16/325 257/E21.252 |
| 7,208,831 B2 * | 4/2007 | Fukazawa | ......... | H01L 21/76807 257/254 |
| 7,300,866 B2 * | 11/2007 | Hong | .................. | H01L 21/7684 257/E21.583 |
| 7,304,384 B2 * | 12/2007 | Koike | ............... | H01L 21/76831 257/751 |
| 8,134,234 B2 * | 3/2012 | Isobayashi | ........ | H01L 21/76805 257/751 |
| 2005/0142831 A1 * | 6/2005 | Shim | ................. | H01L 21/76808 438/597 |
| 2005/0142832 A1 * | 6/2005 | Lee | .................... | H01L 21/76808 438/597 |
| 2005/0158987 A1 * | 7/2005 | Choi | ................. | H01L 21/76808 438/636 |
| 2011/0079907 A1 * | 4/2011 | Farooq | ............. | H01L 23/53238 257/751 |
| 2015/0171011 A1 * | 6/2015 | Kato | .................. | H01L 23/5226 257/762 |

FOREIGN PATENT DOCUMENTS

JP        2012-169590 A        9/2012
* cited by examiner

*Primary Examiner* — Mohsen Ahmadi
(74) *Attorney, Agent, or Firm* — Nath, Goldberg & Meyer; Jerald L. Meyer (57) ABSTRACT

A Cu wiring forming method of forming Cu wiring that is to be arranged in contact with tungsten wiring, by filling Cu into a recess formed in a substrate, includes: removing a tungsten oxide formed on a surface of the tungsten wiring; forming a nitriding preventing film at least on the surface of the tungsten wiring in the recess; forming a barrier film that prevents diffusion of Cu, on a surface in the recess from above the nitriding preventing film; forming a liner film on the barrier film; and filling a Cu film on the liner film.

11 Claims, 6 Drawing Sheets

COPPER WIRING FORMING METHOD, FILM FORMING SYSTEM, AND STORAGE MEDIUM

BACKGROUND OF THE INVENTION

1. Field of the Invention

The present invention relates to a Cu wiring forming method of forming Cu wiring that is to be arranged in contact with tungsten wiring, by filling Cu in a recess such as a trench or hole formed in a substrate, a film forming system and a storage medium storing a program for controlling it.

2. Description of the Related Art

In manufacture of a semiconductor device, various processing such as film forming processing and etching processing on a semiconductor wafer are repeatedly performed to manufacture a desired device, and speed-up of the semiconductor device, shrinking of a wiring dimension, and denser integration are increasingly demanded. Since there is a need to reduce signal delay in order to increase the operating speed of the device, and also from the viewpoint of energy saving of the device, Cu wiring having an interlayer dielectric film lower in resistance and dielectric constant than aluminum (Al) and tungsten (W), is widely used as a wiring material.

As the Cu wiring forming method, there is a conventionally known method in which a barrier film made of tantalum metal (Ta), titanium (Ti), a tantalum nitride (TaN) film, a titanium nitride (TiN) film or the like is formed on the entire interlayer dielectric film formed with a trench or a hole by plasma sputtering being PVD in order to prevent diffusion of Cu, a Cu seed film is formed on the barrier film similarly by plasma sputtering, and Cu plating is further performed thereon to completely fill the trench or the hole.

However, with the scaling dimension of the semiconductor device in recent years, it becomes difficult to fill Cu into the recess such as the fine trench or hole without causing voids by the conventional filling technology using plating after the barrier film and the Cu seed film are formed by PVD. Hence, a technology of forming a ruthenium (Ru) film as a liner film by CVD and forming a Cu film using dry fill by iPVD thereon has been developed (for example, Patent Document 1).

[Patent Document 1] Japanese Laid-open Patent Publication No. 2012-169590

SUMMARY OF THE INVENTION

To realize the further reduction in resistance of the Cu wiring, there are two methods of maximizing a Cu volume in the wiring and of reducing scattering (interface scattering and grain boundary scattering) by electrons.

To maximize the Cu volume, it is necessary to reduce the total thickness of the barrier film and the liner film (TaN by iPVD and Ru by CVD). Note that the TaN film formed by iPVD has a function as a diffusion barrier for Cu and the Ru film formed by CVD has a function as a closely adhesive layer, wetting layer with Cu, so that a stacked structure becomes necessary.

To reduce the scattering by electrons, in particular, the grain boundary scattering, it is effective to increase the Cu grain size, and the Cu grain size can be increased by using dry fill by Cu formed by iPVD.

Figure 6:
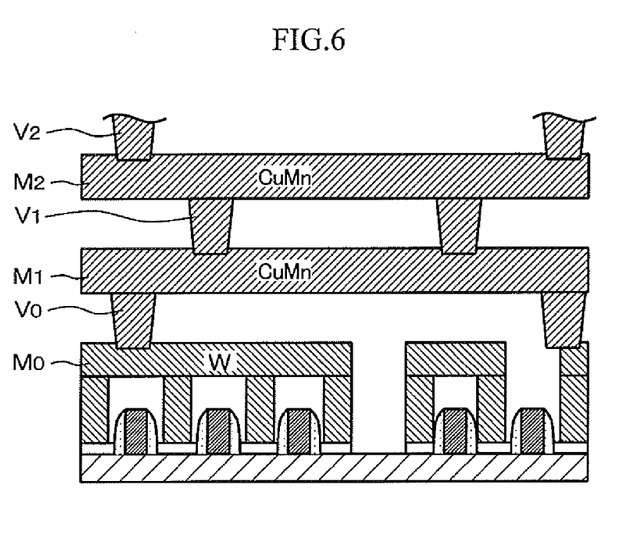
FIG. 6 is a schematic view illustrating the outline of a device structure to which the present invention is applied.

The above method can reduce the wiring resistance but has a problem of the via resistance being high in the Cu wiring in contact with the tungsten wiring. FIG. 6 illustrates a schematic semiconductor device structure, in which tungsten (W) is used as a wiring material for wiring M0 at the lowermost layer and a via layer V0 made of CuMn, wiring M1, a via layer V1, wiring M2, a via layer V2 and so on are stacked on the wiring M0. As illustrated in FIG. 6, the Cu (CuMn) wiring is in contact with the tungsten wiring M0 in the via layer V0. On the other hand, Cu wirings are in contact with each other in layers above the via layer V1.

In forming the Cu wiring, degas and pre-clean are performed before forming the barrier film. Its purpose is to remove moisture on the surface of the dielectric film and a residue during etching/ashing and to reduce a tungsten oxide (WOx) formed on the surface of the tungsten wiring M0. For the pre-clean, hydrogen radicals are used, and the tungsten oxide (WOx) is reduced by the hydrogen radicals. The surface of the tungsten wiring M0 after the degas and pre-clean becomes pure tungsten.

When forming the barrier film composed of the TaN film by iPVD, Ta atoms ejected from a Ta target are ionized in plasma, and a nitrogen gas is supplied into a chamber to generate nitrogen plasma, thereby causing reaction between the Ta atoms and the nitrogen plasma. In this event, the nitrogen radicals and the nitrogen ions generated by the nitrogen plasma can reach the surface of tungsten until a continuous Ta film is formed, so that the pure tungsten reacts with the nitrogen radicals and the nitrogen ions to form a tungsten nitride (WNx) layer. After investigation of an increase in resistance of the tungsten film due to the nitrogen radicals and the nitrogen ions, the present inventors confirmed that the rate of increase in resistance rose when tungsten was exposed to the nitrogen plasma after pre-clean, and the rate of increase in resistance further rose when the nitrogen amount was increased. This is because when subjected to degas and pre-clean, the surface of tungsten becomes pure tungsten that is more likely to be nitrided. If the nitride film WNx exists on the surface of tungsten, there is a problem of the via resistance of the via layer V0 in contact with the tungsten wiring M0 increasing because WNx is high in resistance value.

The present invention has been made in consideration of the above circumstances and has an object to provide a Cu wiring forming method to suppress an increase in via resistance in a process of forming Cu wiring in contact with wiring using tungsten.

To solve the above problem, the present invention provides a Cu wiring forming method of forming Cu wiring that is to be arranged in contact with tungsten wiring, by filling Cu into a recess formed in a substrate, the method including: removing a tungsten oxide formed on a surface of the tungsten wiring; forming a nitriding preventing film at least on the surface of the tungsten wiring in the recess; forming a barrier film that prevents diffusion of Cu, on a surface in the recess from above the nitriding preventing film; forming a liner film on the barrier film; and filling a Cu film on the liner film.

Further, according to another aspect, the resent invention provides a film forming system for forming Cu wiring that is to be arranged in contact with tungsten wiring, by filling Cu in a recess formed in a substrate, the system including: a degas and pre-clean chamber that removes a tungsten oxide formed on a surface of the tungsten wiring; a nitriding preventing film forming apparatus that forms a nitriding preventing film at least on the surface of the tungsten wiring in the recess; a barrier film forming apparatus that forms a barrier film on a surface in the recess from above the nitriding preventing film; a liner film forming apparatus that forms a liner film on the barrier film; a Cu film forming apparatus that fills a Cu film on the liner film; and a control unit that controls operations of the degas and pre-clean chamber, the nitriding preventing film forming apparatus, the barrier film forming apparatus, the liner film forming apparatus, and the Cu film forming apparatus.

According to the present invention, forming a nitriding preventing film for preventing nitriding of a surface of tungsten on the surface of tungsten before forming a barrier film makes it possible to prevent the surface of tungsten from being nitrided in a process of forming the barrier film. As a result, it is possible to suppress an increase in via resistance due to WNx and make the whole device low in resistance.

BRIEF DESCRIPTION OF THE DRAWINGS

FIG. 5A to FIG. 5F are process cross-sectional views for explaining the Cu wiring forming method according to the embodiment of the present invention.

DETAILED DESCRIPTION OF THE INVENTION

Hereinafter, an embodiment of the present invention will be described referring to the drawings.

Figure 1:
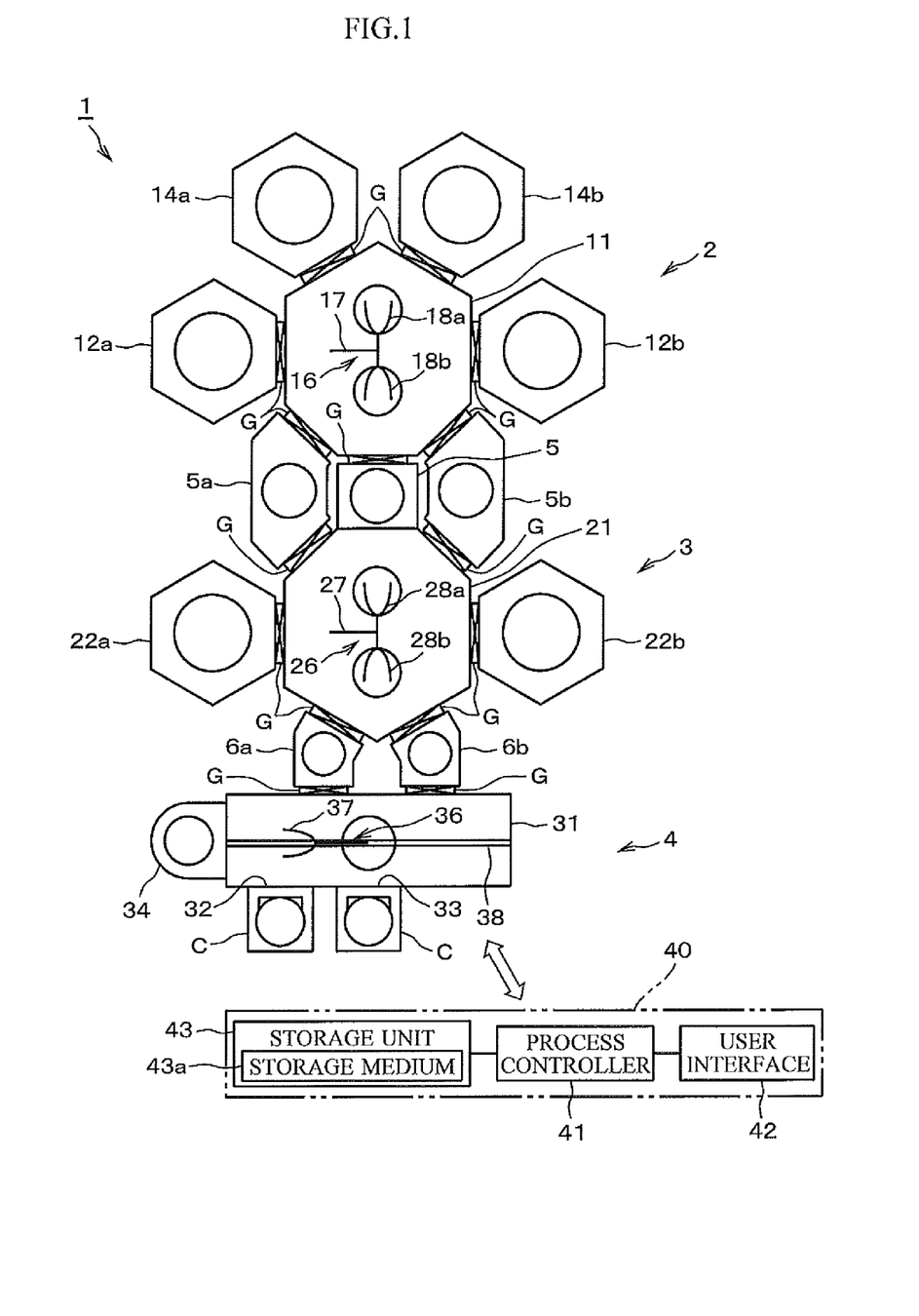
FIG. 1 is a plan view illustrating an example of a multi-chamber film forming system for implementing a Cu wiring forming method according to the present invention.

First of all, a film forming system used in the embodiment of the present invention will be described. FIG. 1 is a plan view illustrating an example of a multi-chamber film forming system for implementing formation of Cu wiring according to the embodiment of the present invention.

A film forming system 1 has: a first processing unit 2 that forms a nitriding preventing film, a barrier film, and a liner film; a second processing unit 3 that forms a Cu film; and a transfer-in/out unit 4, and is for forming Cu wiring on a semiconductor wafer (hereinafter, simply mentioned as a wafer) F.

The first processing unit 2 has a first vacuum transfer chamber 11 having a planar shape forming a heptagon, and two nitriding preventing film and barrier film forming apparatuses 12a, 12b and two liner film forming apparatuses 14a, 14b, which are connected to wall portions corresponding to four sides in a planar view of the first vacuum transfer chamber 11. The nitriding preventing film and barrier film forming apparatus 12a and the liner film forming apparatus 14a which are illustrated on the left side in FIG. 1 and the nitriding preventing film and barrier film forming apparatus 12b and the liner film forming apparatus 14b which are illustrated on the right side in FIG. 1, are arranged at line-symmetric positions. In this embodiment, the nitriding preventing film and the barrier film are formed in the same film forming apparatus 12a, 12b.

To wall portions at line-symmetric positions corresponding to the other two sides in a planar view of the first vacuum transfer chamber 11, degas and pre-clean chambers 5a, 5b that perform degassing and pre-cleaning for the wafer F are connected, respectively. Besides, to a wall portion between the degas and pre-clean chambers 5a and 5b of the first vacuum transfer chamber 11, a pass chamber 5 is connected which delivers the wafer F between the first vacuum transfer chamber 11 and a later-described second vacuum transfer chamber 21.

The nitriding preventing film and barrier film forming apparatuses 12a, 12b, the liner film forming apparatuses 14a, 14b, the degas and pre-clean chambers 5a, 5b, and the pass chamber 5 are connected to the respective wall portions of the first vacuum transfer chamber 11 via gate valves G, and they are linked with the first vacuum transfer chamber 11 by opening the corresponding gate valves G and blocked from the first vacuum transfer chamber 11 by closing the corresponding gate valves G.

The inside of the first vacuum transfer chamber 11 is kept in a predetermined vacuum atmosphere, in which a first transfer mechanism 16 is provided which transfers in/out the wafer F from/to the nitriding preventing film and barrier film forming apparatuses 12a, 12b, the liner film forming apparatuses 14a, 14b, the degas and pre-clean chambers 5a, 5b, and the pass chamber 5. The first transfer mechanism 16 is arranged at almost the center of the first vacuum transfer chamber 11 and has a rotation and expansion/retraction unit 17 that can rotate and expand/retract, and two support arms 18a, 18b that support the wafer F are provided at the tip of the rotation and expansion/retraction unit 17. The two support arms 18a, 18b are attached to the rotation and expansion/retraction unit 17 in a manner to face in opposite directions to each other.

The second processing unit 3 has a second vacuum transfer chamber 21 having a planar shape forming a heptagon, and two Cu film forming apparatuses 22a, 22b which are connected to wall portions corresponding to two opposing sides of the second vacuum transfer chamber 21.

To wall portions corresponding to two sides on the first processing unit 2 side of the second vacuum transfer chamber 21, the above-described degas and pre-clean chambers 5a, 5b are connected respectively, and to a wall portion between the degas and pre-clean chambers 5a and 5b, the above-described pass chamber 5 is connected. In other words, any of the pass chamber 5 and the degas and pre-clean chambers 5a and 5b is provided between the first vacuum transfer chamber 11 and the second vacuum transfer chamber 21, and the degas and pre-clean chambers 5a and 5b are arranged on both sides of the pass chamber 5. Further, to two sides on the transfer-in/out unit 4 side of the second vacuum transfer chamber 21, load-lock chambers 6a, 6b that can perform atmospheric transfer and vacuum transfer are connected, respectively.

The Cu film forming apparatuses 22a, 22b, the degas and pre-clean chambers 5a and 5b, and the load-lock chambers 6a, 6b are connected to the respective wall portions of the second vacuum transfer chamber 21 via gate valves G, and they are linked with the second vacuum transfer chamber 21 by opening the corresponding gate valves G and blocked from the second vacuum transfer chamber 21 by closing the corresponding gate valves G. The pass chamber 5 is connected to the second vacuum transfer chamber 21 via no gate valve G.

The inside of the second vacuum transfer chamber 21 is kept in a predetermined vacuum atmosphere, in which a second transfer mechanism 26 is provided which transfers in/out the wafer F from/to the Cu film forming apparatuses 22a, 22b, the degas and pre-clean chambers 5a and 5b, the load-lock chambers 6a, 6b, and the pass chamber 5. The second transfer mechanism 26 is arranged at almost the center of the second vacuum transfer chamber 21 and has a rotation and expansion/retraction unit 27 that can rotate and expand/retract, and two support arms 28a, 28b that support the wafer F are provided at the tip of the rotation and expansion/retraction unit 27. The two support arms 28a, 28b are attached to the rotation and expansion/retraction unit 27 in a manner to face in opposite directions to each other.

The transfer-in/out unit 4 is provided on the opposite side to the second processing unit 3 across the above-described load-lock chambers 6a, 6b and has an atmospheric transfer chamber 31 to which the load-lock chambers 6a, 6b are connected. In wall portions between the load-lock chambers 6a, 6b and the atmospheric transfer chamber 31, gate valves G are provided. At wall portions opposite to the wall portions to which the load-lock chambers 6a, 6b of the atmospheric transfer chamber 31, two connection ports 32, 33 are provided to which carriers C housing wafers F as substrates to be processed are connected. These connection ports 32, 33 are provided with not-illustrated shutters respectively, and the carriers C in a state of housing the wafers F or being empty are directly attached to the connection ports 32, 33 and the shutters are detached at that time so that the carriers C are linked with the atmospheric transfer chamber 31 while preventing intrusion of outside air. Besides, at the side surface of the atmospheric transfer chamber 31, an alignment chamber 34 is provided where alignment of the wafer F is performed. Inside the atmospheric transfer chamber 31, a transfer mechanism 36 for atmospheric transfer is provided which transfers-in/out the wafer F to/from the carriers C and transfers-in/out the wafer F to/from the load-lock chambers 6a, 6b. The transfer mechanism 36 for atmospheric transfer can travel on a rail 38 along an arrangement direction of the carriers C so as to transfer the wafer F with the wafer F put on a hand 37 at the tip.

The film forming system 1 has a control unit 40 for controlling configuration units of the film forming system 1. The control unit 40 includes: a process controller 41 composed of a microprocessor (computer) that executes control on the configuration units; a user interface 42 composed of a keyboard on which an operator performs input operation and so on of commands to manage the film forming system 1, a display that visualizes and displays an operating status of the film forming system 1 and so on; and a storage unit 43 that stores a control program for realizing the processing performed in the film forming system 1 under control by the process controller 41, various data, and programs for causing the configuration units of the processing apparatuses to perform processing according to processing conditions. Note that the user interface 42 and the storage unit 43 are connected to the process controller 41.

The above programs are stored in a storage medium 43a in the storage unit 43. The storage medium may be a hard disk, or a portable CDROM, DVD, flash memory or the like. Besides, the programs may be transmitted as necessary from another apparatus, for example, over a dedicated line.

Then, when necessary, an arbitrary program is called from the storage unit 43 under an instruction or the like from the user interface 42 and executed by the process controller 41, whereby desired processing is performed in the film forming system 1 under the control of the process controller 41.

In the film forming system 1, a wafer F on which a predetermined pattern having trenches or holes have been formed is taken out of the carrier C by the transfer mechanism 36 for atmospheric transfer, and transferred to the load-lock chamber 6a or 6b. After the load-lock chamber 6a or 6b is reduced in pressure to the same degree of vacuum as that in the second vacuum transfer chamber 21, the wafer F in the load-lock chamber 6a or 6b is taken out by the second transfer mechanism 26, and transferred via the second vacuum transfer chamber 21 to the degas and pre-clean chamber 5a or 5b, where the degas and pre-clean processing is performed on the wafer F. Thereafter, the wafer F in the degas and pre-clean chamber 5a or 5b is taken out by the first transfer mechanism 16, and transferred into the nitriding preventing film and barrier film forming apparatus 12a or 12b via the first vacuum transfer chamber 11. In the nitriding preventing film and barrier film forming apparatus 12a or 12b, for example, a Ta film is formed first as a nitriding preventing film and, for example, a TaN film or the like is then formed as a barrier film. After the barrier film is formed, the wafer F is taken out of the nitriding preventing film and barrier film forming apparatus 12a or 12b by the first transfer mechanism 16, and transferred into the liner film forming apparatus 14a or 14b where, for example, a Ru film is formed as the liner film. After the liner film is formed, the wafer F is taken out of the liner film forming apparatus 14a or 14b by the first transfer mechanism 16 and transferred to the pass chamber 5. Thereafter, the wafer F is taken out by the second transfer mechanism 26, transferred via the second vacuum transfer chamber 21 into the Cu film forming apparatus 22a or 22b, where a Cu film is formed. After the Cu film is formed, the wafer F is taken out of the Cu film forming apparatus 22a or 22b by the second transfer mechanism 26, and transferred to the load-lock chamber 6a or 6b. After the load-lock chamber is returned to the atmospheric pressure, the wafer F on which the Cu film has been formed is taken by the transfer mechanism 36 for atmospheric transfer, and returned into the carrier C. Such processing is repeated for the number of wafers F in the carrier.

Note that the nitriding preventing film is not limited to the aforementioned Ta film but may be made of another high melting point metal material. Besides, the barrier film may be a TiN film or the like in addition to the TaN film.

Figure 2:
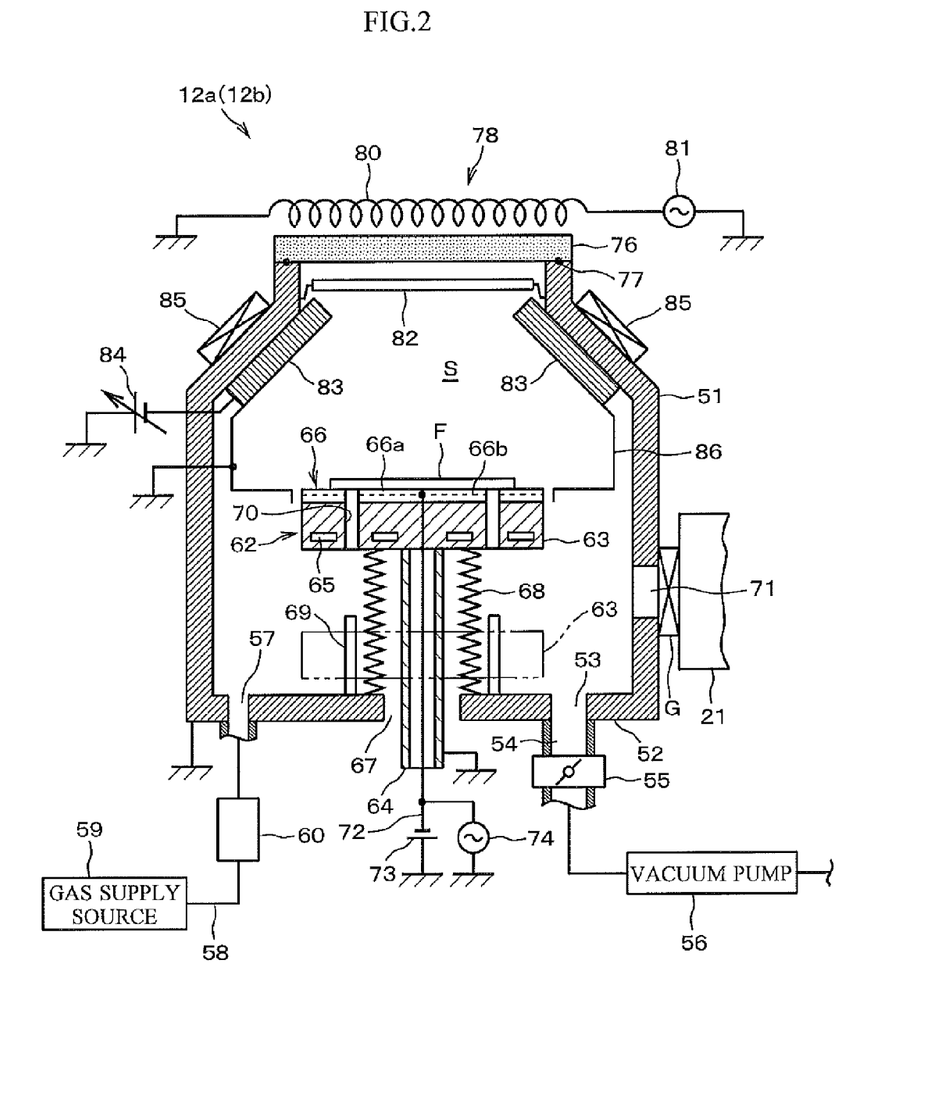
FIG. 2 is a cross-sectional view illustrating an example of a film forming apparatus for forming a nitriding preventing film and a barrier film installed in the film forming system in FIG. 1.

Next, the nitriding preventing film and barrier film forming apparatus 12a (12b) for implementing the method of the present invention will be described.

FIG. 2 is a cross-sectional view illustrating an example of the nitriding preventing film and barrier film forming apparatus 12a (12b). Here, as the film forming apparatus, an ICP (Inductively Coupled Plasma) plasma sputtering apparatus that is an iPVD (Ionized physical vapor deposition) will be described as an example.

As illustrated in FIG. 2, the nitriding preventing film and barrier film forming apparatus 12a (12b) has a processing container 51 formed in a cylindrical shape using, for example, aluminum or the like. The processing container 51 is grounded and has a bottom part 52 provided with an exhaust port 53 to which an exhaust pipe 54 is connected. To the exhaust pipe 54, a throttle valve 55 and a vacuum pump 56 that regulate the pressure are connected to be able to evacuate the processing container 51. The bottom part 52 of the processing container 51 is provided with a gas introduction port 57 that introduces a predetermined gas into the processing container 51. A gas supply pipe 58 is connected to the gas introduction port 57, and a gas supply source 59 for supplying a rare gas as a plasma exciting gas, for example, an Ar gas, and another gas necessary in forming the barrier film, for example, a $N_2$ gas and so on is connected to the gas supply pipe 58. Besides, a gas control unit 60 composed of a gas flow rate controller, a valve and so on intervenes in the gas supply pipe 58.

In the processing container 51, a pedestal mechanism 62 for putting the wafer F being the substrate to be processed is provided. The pedestal mechanism 62 has a pedestal table 63 formed in a disk shape, and a support post 64 in a hollow cylindrical shape that supports the pedestal table 63 and is grounded. The pedestal table 63 is made of a conductive material such as an aluminum alloy, and grounded via the support post 64. In the pedestal table 63, a cooling jacket 65 is provided to supply a refrigerant through a not-illustrated refrigerant flow path. The pedestal table 63 is provided with a thermocouple (not illustrated) so that the wafer temperature can be controlled to a predetermined temperature, for example, about 10° C. by controlling the supply of the refrigerant to the cooling jacket 65 on the basis of the temperature detected by the thermocouple.

An electrostatic chuck 66 in a thin disk shape configured by embedding an electrode 66b in a dielectric member 66a such as alumina is provided on the upper surface side of the pedestal table 63, and thereby can attract and hold the wafer F by an electrostatic force. Further, a lower portion of the support post 64 passes through a through hole 67 formed at the central portion of the bottom part 52 of the processing container 51 and extends downward. The support post 64 is vertically movable by a not-illustrated raising and lowering mechanism and thereby raises and lowers the whole pedestal mechanism 62.

A metal bellows 68 in an accordion shape configured to be expandable and retractable is provided to surround the support post 64, and the metal bellows 68 has an upper end hermetically joined to the lower surface of the pedestal table 63 and a lower end hermetically joined to the upper surface of the bottom part 52 of the processing container 51, so as to allow the raising and lowering movement of the pedestal mechanism 62 while maintaining the hermeticity in the processing container 51.

Further, for example, three (only two of them are illustrated in FIG. 2) support pins 69 are provided to stand upward on the bottom part 52, and pin insertion holes 70 corresponding to the support pins 69 are formed in the pedestal table 63. Accordingly, when the pedestal table 63 is lowered, the support pins 69 passed through the pin insertion holes 70 receive the wafer F by their upper end portions, and can move and put the wafer F to/from the transfer arm (not illustrated) that enters from the outside. Therefore, a transfer-in/out port 71 for allowing the transfer arm to enter is provided in a lower side wall of the processing container 51, and the gate valve G formed to be openable and closable is provided at the transfer-in/out port 71. On the opposite side to the gate valve G, the above-described second vacuum transfer chamber 21 is provided.

Further, a chuck power supply 73 is connected to the above-described electrode 66b of the electrostatic chuck 66 via a feed line 72, and the chuck power supply 73 applies a direct-current voltage to the electrode 66b to thereby attract and hold the wafer F by the electrostatic force. Besides, a bias high-frequency power supply 74 is connected to the feed line 72 so that a high-frequency power for bias is supplied to the electrode 66b of the electrostatic chuck 66 via the feed line 72 to apply bias power to the wafer F. The frequency of the high-frequency power is preferably 400 kHz to 60 MHz and, for example, 13.56 MHz is employed.

On the other hand, at a ceiling portion of the processing container 51, a transmission plate 76 that is made of dielectric such as alumina and transmissive to high frequency is hermetically provided via a seal member 77 such as an O-ring. Above the transmission plate 76, a plasma generation source 78 is provided for generating plasma by making a rare gas as a plasma exciting gas, for example, an Ar gas into plasma in a processing space S inside the processing container 51. When forming the nitriding preventing film, for example, a Ta film, the $N_2$ gas is not used but only the Ar gas is used, whereas when forming the barrier film, a mixture of the Ar gas and the $N_2$ gas is used. Note that as the plasma exciting gas when forming the barrier film, another rare gas such as He, Ne, Kr or the like may be used in place of Ar.

The plasma generation source 78 has an induction coil 80 provided corresponding to the transmission plate 76, and a high-frequency power supply 81 of, for example, 13.56 MHz for generating plasma is connected to the induction coil 80 so as to introduce a high-frequency power into the processing space S via the transmission plate 76 to form an induction field.

Further, directly below the transmission plate 76, a buffer plate 82 made of, for example, aluminum for diffusing the introduced high-frequency power is provided. Further, below the buffer plate 82, an annular (conical shape) Ta target 83 having a cross-section, for example, tilted inward is provided to surround an upper side portion of the processing space S. To the Ta target 83, a target-voltage variable direct-current power supply 84 that applies a direct-current power for attracting Ar ions is connected. Note that an alternating-current power supply may be used in place of the direct-current power supply.

On the outer peripheral side of the Ta target 83, a magnet 85 for imparting a magnetic field thereto is provided. The Ta target 83 is sputtered as metal atoms or a metal atom group of Ta by the Ar ions in the plasma and most of them are ionized when passing through the plasma.

Besides, a protective cover member 86 in a cylindrical form made of, for example, aluminum or cooper is provided below the Ta target 83 to surround the processing space S. The protective cover member 86 is grounded and has a lower portion bent inward and located near the side portion of the pedestal table 63. Accordingly, an inner end portion of the protective cover member 86 is provided to surround the outer peripheral side of the pedestal table 63.

Note that the configuration units of a Ta film forming apparatus is controlled by the above-described control unit 40 (see FIG. 1).

In the nitriding preventing film and barrier film forming apparatus 12a (12b) configured as described above, the wafer F is transferred into the processing container 51 illustrated in FIG. 2 and put on the pedestal table 63 and attracted by the electrostatic chuck 66, and the following operation is performed under the control of the control unit 40.

First, while supplying the Ar gas (the $N_2$ gas is mixed therewith when forming the barrier film) at a predetermined flow rate by operating the gas control unit 60 into the processing container 51 brought into a predetermined vacuum state, for example, to a pressure of 35 to 90 mT, preferably about 65 mT when forming the nitriding preventing film or to a pressure of 5 to 90 mT, preferably about 10 mT when forming the barrier film by actuating the vacuum pump 56, the throttle valve 55 is controlled to keep the inside of the processing container 51 at a predetermined degree of vacuum. Then, the direct-current voltage is applied from the variable direct-current power supply 84 to the Ta target 83, and the high-frequency power (plasma power) is supplied from the high-frequency power supply 81 of the plasma generation source 78 to the induction coil 80. On the other hand, a predetermined high-frequency power for bias is supplied from the bias high-frequency power supply 74 to the electrode 66b of the electrostatic chuck 66. Note that the power of the variable direct-current power supply 84 is 1000 W to 6000 W, preferably about 2300 W when forming the nitriding preventing film and about 1600 W when forming the barrier film, the plasma power is 1000 W to 5500 W, preferably 5250 W when forming the nitriding preventing film and about 4500 W when forming the barrier film, and the high-frequency power for bias is 1000 W or less, preferable about 200 W when forming the nitriding preventing film and about 900 W when forming the barrier film.

Thus, in the processing container 51, Ar plasma is formed by the high-frequency power supplied to the induction coil 80 to generate Ar ions, and the ions are attracted by the direct-current voltage applied to the Ta target 83 to collide with the Ta target 83, so that the Ta target 83 is sputtered to eject Ta particles. In this event, the amount of the Ta particles ejected by the direct-current voltage applied to the Ta target 83 is optimally controlled.

Further, the Ta atoms and Ta atom group being the Ta particles from the sputtered Ta target 83 are ionized when passing through the plasma. Here, the Ta particles scatter in a downward direction in a state in which the ionized Ta ions and neutral Ta atoms that are electrically neutral are mixed.

Then, when the Ta ions enter a region of an ion sheath having a thickness of about several millimeters formed on the wafer F surface by the high-frequency power for bias applied from the bias high-frequency power supply 74 to the electrode 66b of the electrostatic chuck 66, the Ta ions are attracted to accelerate toward the wafer F with a strong directivity and deposit on the wafer F to form into a Ta thin film. Note that regulating the bias power to be applied from the bias high-frequency power supply 74 to the electrode 66b of the electrostatic chuck 66 makes it possible to regulate film formation with Ta and etching with Ar to thereby realize appropriate film formation. When forming the TaN film being the barrier film, the Ta atoms ejected from the Ta target are ionized in the plasma and the $N_2$ gas is supplied into the processing container 51 to generate nitrogen plasma, thereby causing reaction between the Ta atoms and the nitrogen plasma.

Next, the Cu film forming apparatus will be described.

As the Cu film forming apparatus 22a (22b), the film forming apparatus (iPVD) having the same configuration as that of the film forming apparatus in FIG. 2 can be used to form a film by plasma sputtering only by changing the target 83 to Cu. In this event, a resistance heater covered with an insulating material may be embedded above the cooling jacket 65 in the pedestal table 63 as necessary to heat the wafer to a desired temperature.

Figure 3:
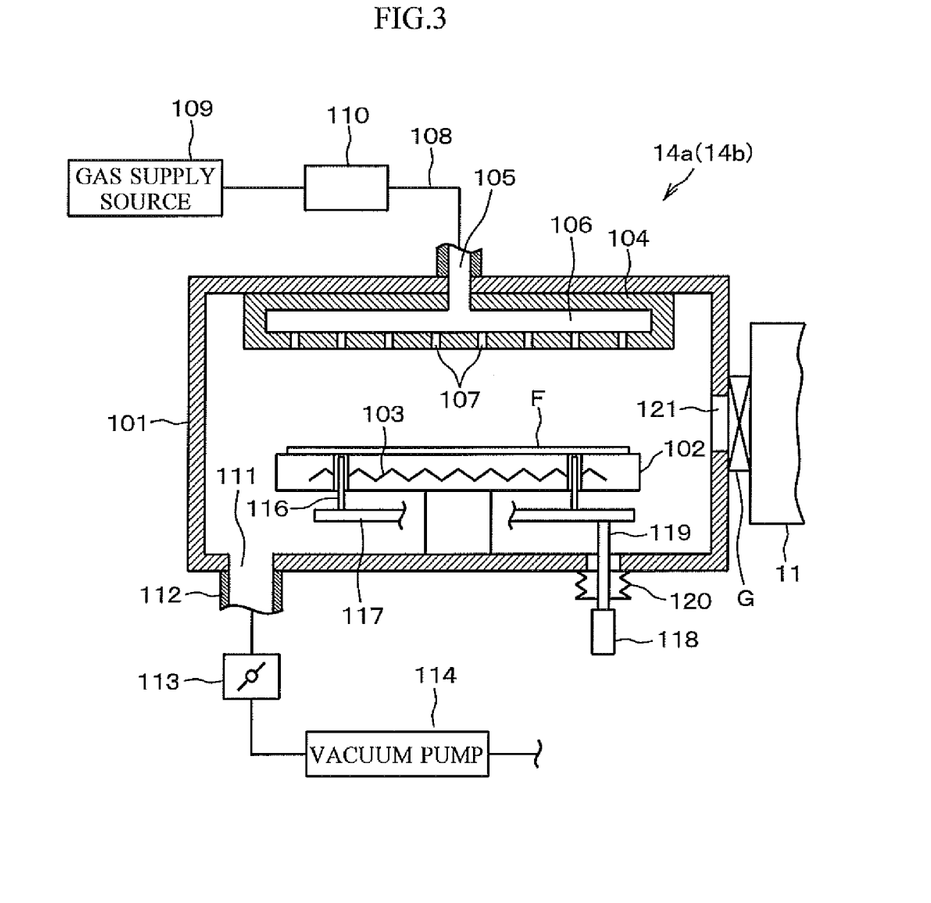
FIG. 3 is a cross-sectional view illustrating an example of a film forming apparatus for forming a liner film installed in the film forming system in FIG. 1.

Next, the liner film forming apparatus 14a (14b) for forming the Ru film as the liner film will be described. The liner film can be preferably formed by the thermal CVD. FIG. 3 is a cross-sectional view illustrating an example of the liner film forming apparatus for forming the Ru film by the thermal CVD.

As illustrated in FIG. 3, the liner film forming apparatus 14a (14b) has a processing container 101 formed into a cylinder made of, for example, aluminum or the like. Inside the processing container 101, a pedestal table 102 made of ceramic such as AN for putting the wafer F thereon is arranged, and a heater 103 is provided in the pedestal table 102. The heater 103 generates heat by being fed with power from a heater power supply (not illustrated).

At a ceiling wall of the processing container 101, a shower head 104 for introducing a processing gas for forming the Ru film, a purge gas or the like in a shower form into the processing container 101 is provided to face the pedestal table 102. The shower head 104 has a gas introduction port 105 at its upper portion, a gas diffusing space 106 formed therein, and many gas discharge ports 107 formed at its bottom surface. A gas supply pipe 108 is connected to the gas introduction port 105, and a gas supply source 109 for supplying the processing gas for forming the Ru film, the purge gas or the like is connected to the gas supply pipe 108. Besides, a gas control unit 110 composed of a gas flow rate controller, a valve and so on intervenes in the gas supply pipe 108. As the gas for forming the Ru film, ruthenium carbonyl ($Ru_3(CO)_{12}$) can be exemplified. The ruthenium carbonyl is thermally decomposed into Ru and can form the Ru film on the wafer F.

A bottom portion of the processing container 101 is provided with an exhaust port 111 to which an exhaust pipe 112 is connected. To the exhaust pipe 112, a throttle valve 113 and a vacuum pump 114 that regulate the pressure are connected to be able to evacuate the processing container 101.

For the pedestal table 102, three (only two of them are illustrated) wafer support pins 116 for wafer transfer are provided to be able to protrude and retract with respect to the surface of the pedestal table 102, and the wafer support pins 116 are fixed to a support plate 117. The wafer support pins 116 are raised and lowered via the support plate 117 by raising and lowering a rod 119 by a drive mechanism 118 such as an air cylinder. Note that a numeral 120 is a bellows. On the other hand, a side wall of the processing container 101 is formed with a wafer transfer-in/out port 121 so that the wafer F is transferred in/out from/to the first vacuum transfer chamber 11 with the gate valve G opened.

In the Ru liner film forming apparatus 14a (14b), after the gate valve G is opened and the wafer F is put on the pedestal table 102, the gate valve G is closed. In a state in which the heater 103 heats the wafer F to a predetermined temperature via the pedestal table 102 while the vacuum pump 114 exhausts the gas from the inside of the processing container 101 to regulate the inside of the processing container 101 to a predetermined pressure, the gas supply source 109 introduces the processing gas such as a ruthenium carbonyl ($Ru_3(CO)_{12}$) gas into the processing container 101 via the gas supply pipe 108 and the shower head 104. Thus, the reaction of the processing gas proceeds on the wafer F to form a Ru film on the surface of the wafer F.

For the formation of the Ru film, another film forming material other than ruthenium carbonyl, for example, pentadienyl compounds of ruthenium such as (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyeruthenium, bis(2,4-methylpentadienyl)(ethylcyclopentadienyl)ruthenium, can be used together with decomposed gas such as an $O_2$ gas. Besides, the Ru film can be formed by PVD. However, it is preferable to perform the film formation by the CVD using ruthenium carbonyl because excellent step coverage can be achieved and impurities in the film can be reduced.

Figure 4:
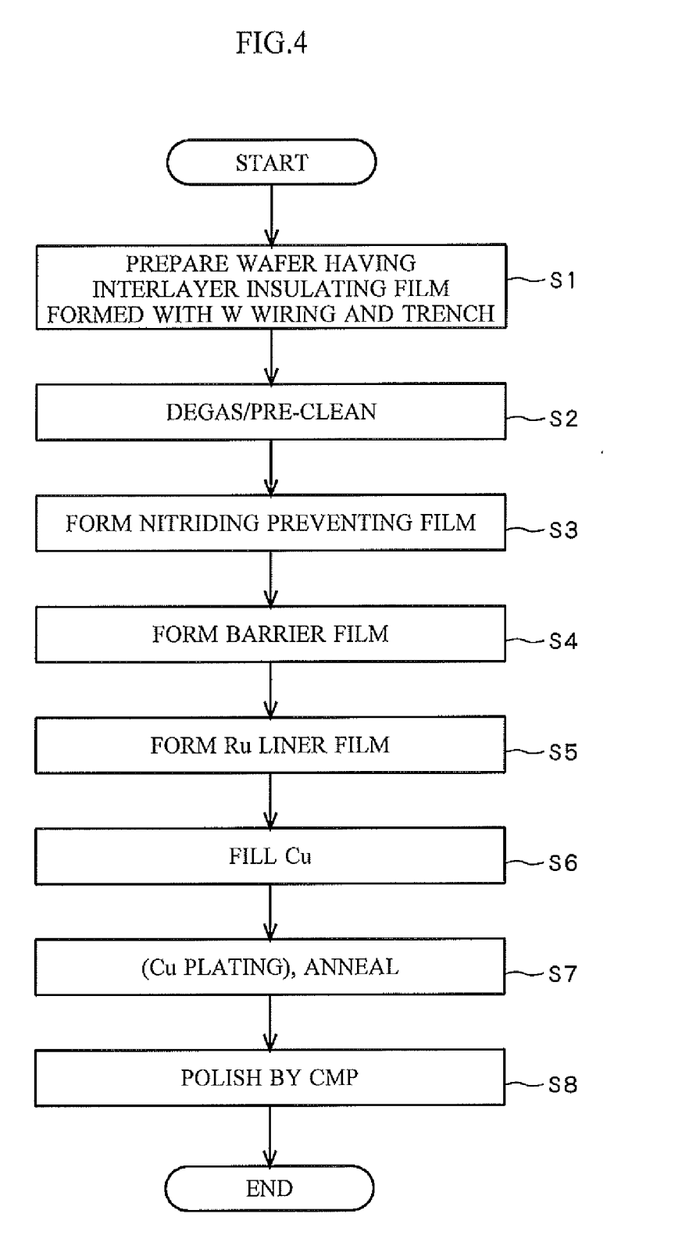
FIG. 4 is a flowchart of the Cu wiring forming method according to an embodiment of the present invention.

Next, the Cu wiring forming method according to the embodiment of the present invention will be described referring to a flowchart in FIG. 4 and process cross-sectional views in FIG. 5A to FIG. 5F. Note that this embodiment is applied to a via layer V0 in contact with tungsten wiring M0 (see FIG. 6).

Figure 5A:
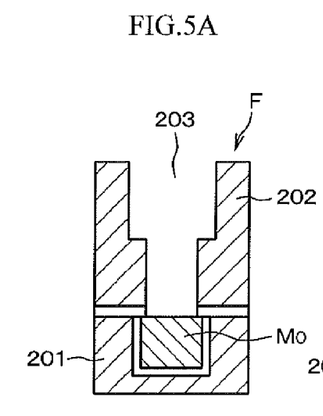
FIG. 5A shows a cross-sectional view of a wafer before film formation.

In this embodiment, a wafer F having an interlayer dielectric film 202 such as a $SiO_2$ film on a lower structure 201 provided with the tungsten (W) wiring M0 and having a trench 203 formed as a recess is prepared first (Step S1, FIG. 5A). Then, the wafer F is transferred into the film forming system 1 in FIG. 1, and the degas and pre-clean processing of removing moisture adhering to the surface of the dielectric film and a residue during etching/ashing by a degas process and a pre-clean process to thereby reduce a tungsten oxide (WOx) formed on the surface of the tungsten wiring M0 is performed in the degas and pre-clean chamber 5a or 5b(Step S2).

Figure 5B:
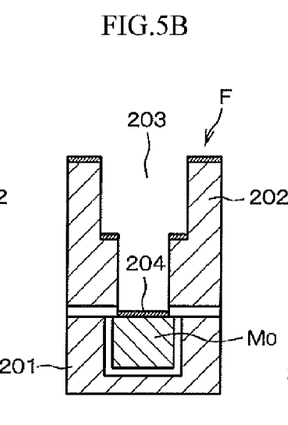
FIG. 5B shows a cross-sectional view where a nitriding preventing film has been formed.

Then, the wafer F is transferred into the nitriding preventing film and barrier film forming apparatus 12a or 12b, and a nitriding preventing film 204 (Ta film) of preventing a WNx layer from being formed is formed on the surface of tungsten (Step S3, FIG. 5B). The nitriding preventing film 204 only needs to cover only the entire upper surface of the tungsten wiring M0, but may be formed on a horizontal plane including the inner surface and the upper surface of the trench 203 as illustrated in FIG. 5B. As the nitriding preventing film 204, a high melting point metal material other than the Ta film can also be used. The film thickness of the nitriding preventing film 204 is 1 to 10 nm, preferably about 5 nm.

Figure 5C:
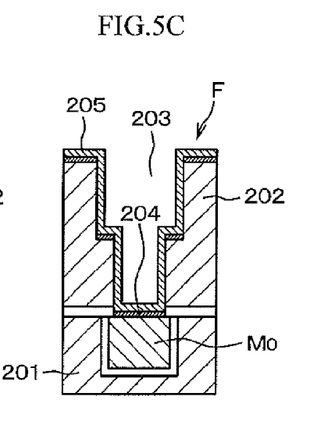
FIG. 5C shows a cross-sectional view where a barrier film has been formed.

After the nitriding preventing film 204 is formed, the $N_2$ gas is supplied into the processing container to form a barrier film 205 that blocks diffusion of Cu, on the entire surface including the surface of the trench 203 (Step S4, FIG. 5C). As the barrier film 205, the one having a high barrier property with respect to Cu and a low resistance is preferable, and a TaN film, a TiN film and the like can be preferably used. Besides, a TaCN film, a WN film, a WCN film, a ZrN film, a VN film, a NbN film and the like can also be used. The Cu wiring becomes lower in resistance as the volume of Cu filled in the trench or hole becomes larger, so that it is preferable to form the barrier film 205 as thin as possible. The thickness is 1 to 10 nm, more preferably about 3 nm. The nitriding preventing film 204 and the barrier film 205 can be formed by plasma sputtering, and the nitriding preventing film 204 is formed in a processing time of, for example, about 12 sec and the barrier film 205 is formed in a processing time of, for example, about 6 sec. Besides, the films can be formed by another PVD such as normal sputtering, ion plating or the like, and can also be formed by CVD, ALD, or CVD or ALD using plasma.

Figure 5D:
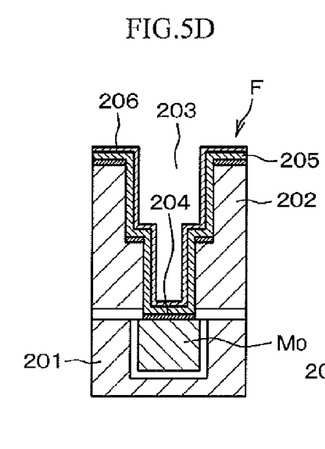
FIG. 5D shows a cross-sectional view where a liner film has been formed.

Subsequently, the liner film forming apparatus 14a or 14b forms a Ru liner film 206 on the barrier film 205 (Step S5, FIG. 5D). It is preferable to form the Ru liner film 206 to be thin, for example, 1 to 5 nm from the viewpoint of making the Cu to be filled large in volume and the wiring low in resistance. The Ru liner film 206 can be preferably formed by the thermal CVD by the above-described film forming apparatus as illustrated in FIG. 3 using ruthenium carbonyl ($Ru_3(CO)_{12}$) as a film forming material. Thus, a very thin Ru film with a high purity can be formed at high step coverage. The Ru liner film 206 can also be formed as described above by the CVD or PVD using another film forming material other than ruthenium carbonyl, for example, pentadienyl compounds of ruthenium such as (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyeruthenium, bis(2,4-methylpentadienyl)(ethylcyclopentadienyl)ruthenium.

Subsequently, the Cu film forming apparatus 22a or 22b composed of the plasma sputtering apparatus such as the iPVD as illustrated in FIG. 2 is used to apply bias to the pedestal table for the wafer F to thereby form a Cu film 207 that will be the Cu wiring and fill the trench 203 (Step S6, FIG. 5E). In order to increase the electromigration resistance, the Cu film may be formed of an alloy such as CuMn, CuAl or the like.

Figure 5E:
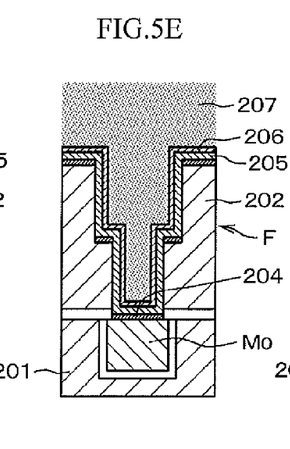
FIG. 5E shows a cross-sectional view where a Cu film has been filled.
Figure 5F:
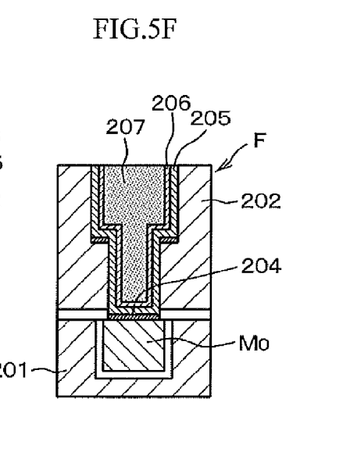
FIG. 5F shows a cross-sectional view after polishing.

The Cu film is formed in the Cu film forming apparatus 22a or 22b up to a flat portion at the upper portion of the trench 203 or fill the trench 203 in the film forming system 1 as illustrated in FIG. 5E, and then transferred out of the film forming system 1 and transferred to a not-illustrated Cu plating apparatus, where a Cu plating layer is formed on the entire surface of the wafer F. Thereafter, annealing is performed on the wafer F to increase the grain size of Cu and stabilize the Cu plating layer (Step S7), and then CMP (Chemical Mechanical Polishing) is performed to polish the surface of the wafer F to completely remove the Ru liner film 206 and the barrier film 205 on the surface (Step S8, FIG. 5F). Thus, the Cu film 207 remaining in the trench 203 functions as the Cu wiring.

As described above, according to the present invention, provision of the nitriding preventing film 204 that prevents nitriding of the surface of the tungsten wiring M0 makes it possible to prevent formation of WNx during formation of the barrier film 205 and avoid increase in via resistance of the via layer V0 directly on the tungsten wiring M0.

Figure 7:
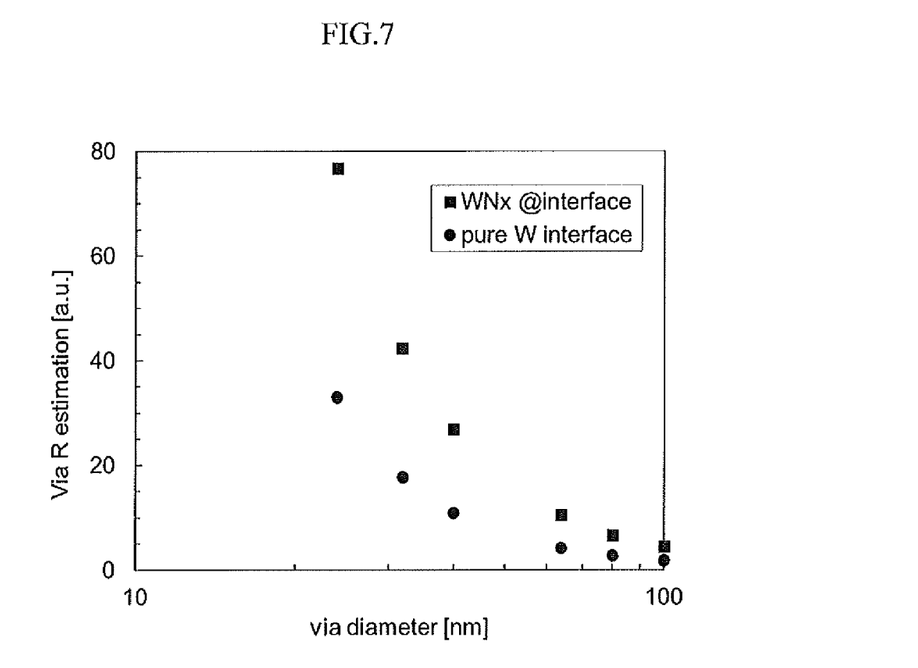
FIG. 7 is a graph comparing via resistances with respect to a via diameter about a case where a nitride film exists on a surface of tungsten and a case where no nitride film exists on a surface of tungsten.

FIG. 7 is a graph comparing the via resistances in a case where a WNx layer is formed on the surface of tungsten (square points) and a case where no WNx layer is formed (circular points) when the TaN layer, the Ru layer, and the Cu layer are stacked on tungsten. It was found that the resistance is lower in the case where no WNx layer is formed and the difference prominently arises especially in the case where the via diameter is small.

A preferred embodiment of the present invention has been described above with reference to the accompanying drawings, but the present invention is not limited to the embodiment. It should be understood that various changes and modifications are readily apparent to those skilled in the art within the scope of the technical spirit as set forth in claims, and those should also be covered by the technical scope of the present invention.

For example, though the film for preventing nitriding of tungsten is the Ta film in the above embodiment, the film is not limited to this but may be made of another high melting point metal such as Ti, Ru, Zr, V, Nb or the like. Besides, the Ta film is formed using iPVD in the above embodiment but may be formed using ALD, PEALD, or CVD.

Further, though the case using the ICP plasma sputtering apparatus for filling Cu has been described in the above embodiment, the plasma sputtering apparatus is not limited to this but may be another kind of plasma sputtering apparatus, and another kind of PVD apparatus may be used as long as it can regulate the attraction of the Cu ions and plasma gas generated ions.

Besides, the film forming system is not limited to the kind illustrated in FIG. 1 but may be a kind in which all film forming apparatuses are connected to one transfer apparatus. Further, the film forming system is not the multi-chamber system as illustrated in FIG. 1 but may be a system in which separately provided apparatuses form the nitriding preventing film, the barrier film, the liner film, and the Cu film, respectively.

Besides, though the semiconductor wafer has been described as an example of the substrate to be processed in the above embodiment, the semiconductor wafer includes not only silicon but also compound semiconductors such as GaAs, SiC, GaN, and the present invention is also applicable not only to the semiconductor wafer but also to a glass substrate used for FPD (Flat Panel Display) such as a liquid crystal display device, a ceramic substrate and the like as a matter of course.

EXPLANATION OF CODES 1 film forming system
5a, 5b degas and pre-clean chamber 12a, 12b nitriding preventing film and barrier film forming apparatus
14a, 14b liner film forming apparatus
22a, 22b Cu film forming apparatus
40 control unit
51 processing container
56 vacuum pump
59 gas supply source
83 Ta target
201 lower structure
202 interlayer dielectric film
203 trench
204 nitriding preventing film
205 barrier film
206 liner film
207 Cu film
M0 tungsten wiring
F semiconductor wafer

What is claimed is:

1. A method of forming a Cu wiring in contact with tungsten wiring, by filling Cu into a recess formed in a substrate, the method comprising:
   removing a tungsten oxide formed on a surface of the tungsten wiring;
   forming a nitriding preventing film at least on the surface of the tungsten wiring in the recess;
   forming a barrier film that prevents diffusion of Cu, on a surface in the recess from above the nitriding preventing film;
   forming a liner film on the barrier film; and
   filling a Cu film on the liner film,
   wherein the barrier film is a metal nitride film or a metal carbonitride film and wherein the nitriding preventing film is a tantalum film.

2. The Cu wiring forming method according to claim 1, wherein the barrier film is a tantalum nitride film.

3. The Cu wiring forming method according to claim 2, wherein the nitriding preventing film and the barrier film are formed in a same film forming apparatus.

4. The Cu wiring forming method according to claim 1, wherein the nitriding preventing film is formed by PVD.

5. The Cu wiring forming method according to claim 1, wherein the barrier film is formed by PVD.

6. The Cu wiring forming method according to claim 1, wherein the nitriding preventing film is made to have a thickness of 1 to 10 nm.

7. The Cu wiring forming method according to claim 1, wherein the liner film is a ruthenium film.

8. The Cu wiring forming method according to claim 1, wherein the liner film is formed by CVD.

9. The Cu wiring forming method according to claim 1, wherein the Cu film is formed by PVD.

10. The Cu wiring forming method according to claim 1, wherein the recess is a trench or a hole.

11. The Cu wiring forming method according to claim 1, wherein the barrier film is selected from the group consisting of a TaN film, a TiN film, a TaCN film, a WN film, a WCN film, a ZrN film, a VN film and a NbN film.

* * * * *